United States Patent
McCune, Jr.

(10) Patent No.: US 8,364,099 B2
(45) Date of Patent: Jan. 29, 2013

(54) METHODS AND APPARATUS FOR CONTROLLING LEAKAGE AND POWER DISSIPATION IN RADIO FREQUENCY POWER AMPLIFIERS

(75) Inventor: Earl W. McCune, Jr., Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 1368 days.

(21) Appl. No.: 11/773,650

(22) Filed: Jul. 5, 2007

(65) Prior Publication Data

US 2009/0009243 A1    Jan. 8, 2009

(51) Int. Cl.
*H04B 1/04* (2006.01)
(52) U.S. Cl. .................... 455/114.2; 455/127.5; 375/300
(58) Field of Classification Search ............... 455/114.1, 455/114.2, 127.5, 127.1; 331/55; 375/297, 375/300, 301
See application file for complete search history.

(56) References Cited

U.S. PATENT DOCUMENTS

| | | | |
|---|---|---|---|
| 3,919,656 A | 11/1975 | Sokal et al. | |
| 6,198,347 B1 | 3/2001 | Sander et al. | |
| 6,411,661 B1 * | 6/2002 | Nguyen et al. | 375/336 |
| 6,445,253 B1 * | 9/2002 | Talbot | 331/57 |
| 6,734,724 B1 | 5/2004 | Schell et al. | |
| 6,759,819 B2 * | 7/2004 | Horng et al. | 318/400.32 |
| 7,010,276 B2 | 3/2006 | Sander et al. | |
| 7,071,792 B2 | 7/2006 | Meck | |
| 2002/0094796 A1 * | 7/2002 | Woods et al. | 455/260 |
| 2004/0239372 A1 | 12/2004 | Hung et al. | |

* cited by examiner

*Primary Examiner* — Christian Hannon (57) ABSTRACT

A radio frequency power amplifier (RF PA) apparatus includes an RF PA and a waveform converter. The waveform converter is configured to receive a sinusoidal RF signal and generate a nonsinusoidal RF signal, which is used to drive an active device (e.g., a field effect transistor (FET) or bipolar junction transistor (BJT)) of the RF PA. The nonsinusoidal RF signal, which may comprise a square wave or a substantially-square wave signal, has signal characteristics that result in less leakage through the active device's input-output parasitic capacitance, compared to the leakage that would result if the sinusoidal RF signal was used to drive the active device. The leakage control methods and apparatus of the present invention may be advantageously employed in a variety of applications including, for example, RF polar transmitters.

16 Claims, 8 Drawing Sheets

METHODS AND APPARATUS FOR CONTROLLING LEAKAGE AND POWER DISSIPATION IN RADIO FREQUENCY POWER AMPLIFIERS

FIELD OF THE INVENTION

The present invention relates to power amplifiers. More specifically, the present invention relates to methods and apparatus for controlling leakage and power dissipation in radio frequency power amplifiers (RF PAs).

BACKGROUND OF THE INVENTION

Power efficiency is a principal objective in the design of battery-powered wireless communications devices. In these types of devices the radio frequency RF output stage of the transmitter, in particular the RF power amplifier (or RF PA), is the major consumer of power. For this reason substantial efforts have been directed towards ways of improving the efficiency of the RF PA output stage in battery-powered wireless communication devices.

One approach to improving power efficiency is to employ what is known as a "switch-mode" PA in the transmitter output stage. Switch-mode PAs employ one or more switches (typically bipolar junction transistors (BJTs) or field-effect transistors (FETs)) to drive the transmitter load. As explained in more detail below, this results in a much more efficient use of power, compared to non-switched amplifier approaches.

Figure 1:
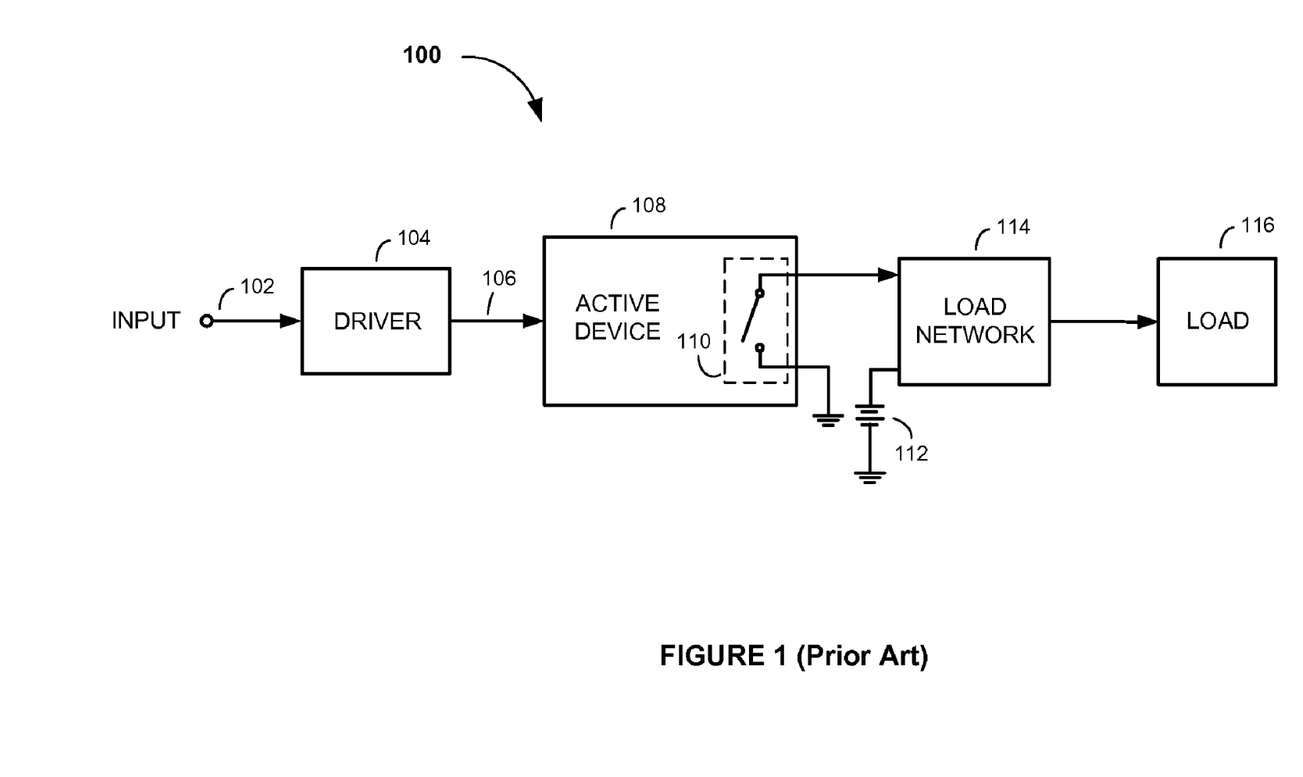
FIG. 1 is a diagram of a conventional switch-mode power amplifier (PA) circuit.

FIG. 1 is a block diagram of a conventional switch-mode PA circuit 100, as described in U.S. Pat. No. 3,919,656 to Sokal et al. An input signal is coupled to an input terminal 102 of a driver stage 104 of the circuit 100. The driver stage 104 is configured to control an active device 108 (e.g., a BJT or FET) via a signal coupled over lead 106. The active device 108 acts substantially as a switch when appropriately driven by the driver stage 104. The output port of the active device 108 is therefore symbolically represented as a single-pole single-throw switch 110 in the drawing. Connected across the switch 110 is a series combination of a direct current (DC) powers supply 112 (e.g. a battery) and the input port of a load network 114. The output port of the load network 114 is connected to a load 116. As the switch 110 is cyclically operated at the desired alternating current (AC) output frequency, DC energy from the power supply 112 is converted into AC energy at the switching frequency.

Figure 2A:
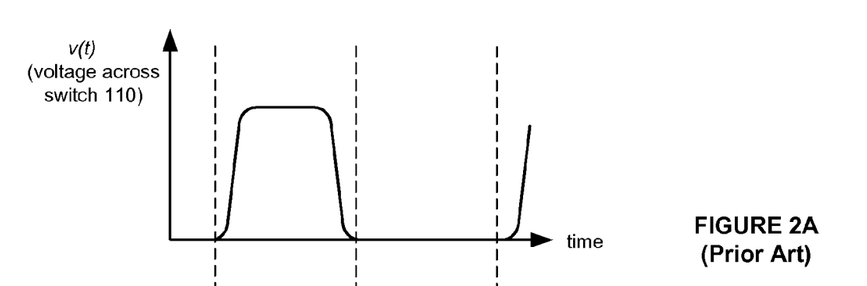
FIG. 2A is a voltage v. time diagram of the voltage dropped across the switch of the switch-mode PA in FIG. 1.
Figure 2B:
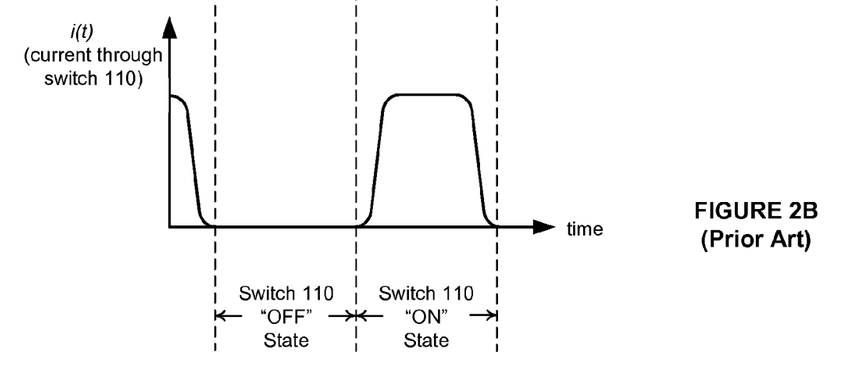
FIG. 2B is a current v. time diagram of the current passed through the switch of the switch-mode PA in FIG. 1.

The high efficiency attribute of switch-mode PAs derives from the fact that the transistors are operated so that they dissipate very little power. FIGS. 2A and 2B are signal waveforms, of the voltage v(t) dropped across the switch 110 and the current i(t) passed through the switch 110 of the switch-mode PA circuit 100 in FIG. 1. The drive signals applied to the switch 110 are such that the switch 110 is either in a compressed state or a cut-off state. During times when the switch 110 is compressed (i.e., when the switch is closed or 'ON') appreciable current flows through the switch 110, while the voltage across it is very nearly zero. During times when the switch 110 is cut-off (i.e., when the switch is open or 'OFF') nearly all of the voltage supplied by the power supply 112 is dropped across the switch 110, and the current flowing through it is very nearly zero. When operated in this manner the amplifier's output depends on the amplitude of the power applied to the drain (or collector if a BJT is used) of the transistor, and not on the magnitude of the signal applied to the gate (or base, in the case of a BJT) of the transistor. Because the current passed through the switch, and the voltage dropped across the switch, are never both large at the same time, very little power is dissipated by the switch.

Figure 3:
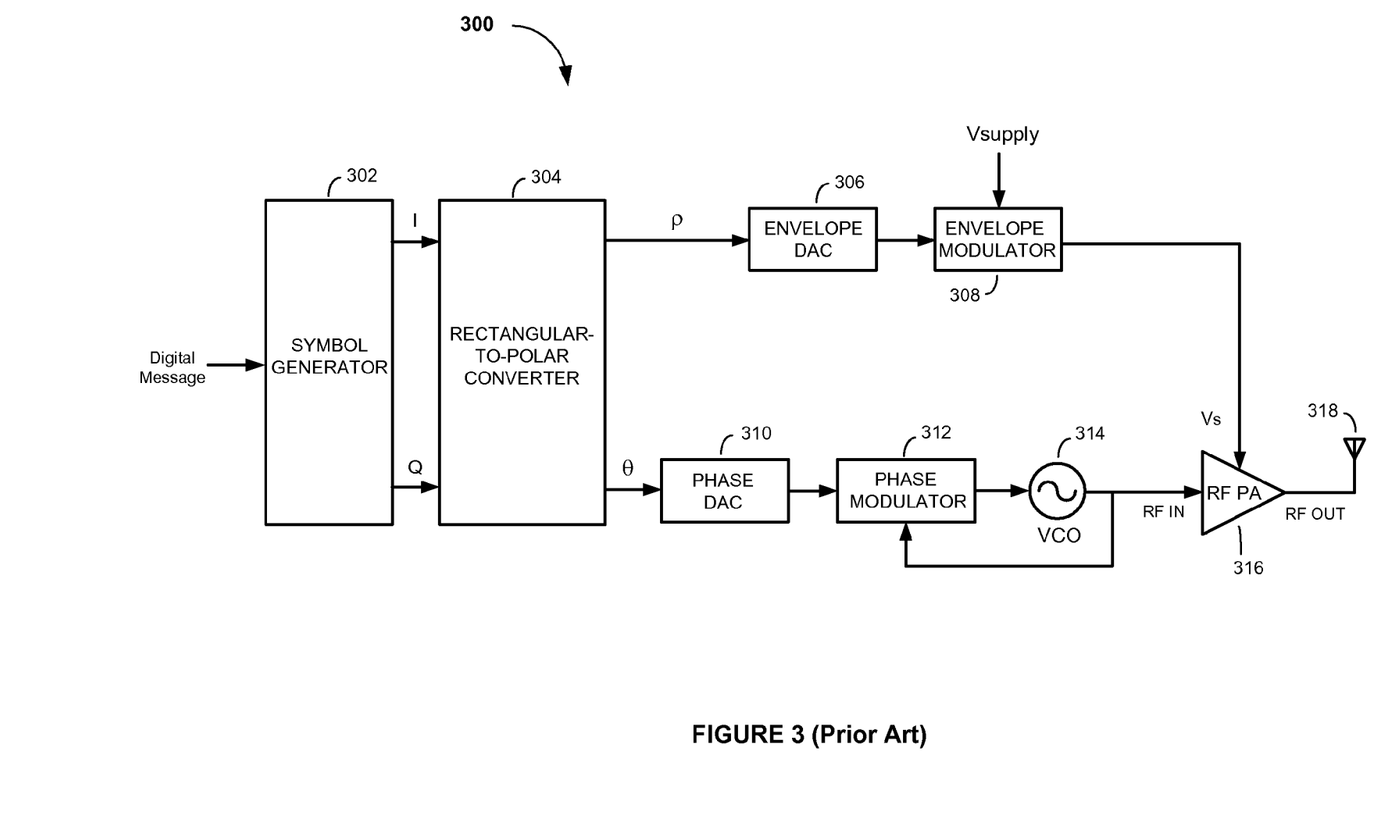
FIG. 3 is a drawing of a conventional polar transmitter.

The superior power efficiency properties of switch-mode PAs is the impetus for their use in modern battery powered RF transmitters. FIG. 3 shows, for example, how a switch-mode RF PA 316 is employed in a polar transmitter 300. The polar transmitter 300 comprises a symbol generator 302; a rectangular-to-polar converter 304; an envelope path including an envelope digital to analog converter (DAC) 306 and an envelope modulator 308; a phase path including a phase DAC 310, a phase-locked loop (PLL) including a phase modulator 312 and a voltage controlled oscillator (VCO) 314; an RF PA 316; and an antenna 318.

The polar transmitter 300 operates by first receiving a digital message to be transmitted from the symbol generator 302. Using the digital data in the digital message, the symbol generator 302 generates in-phase (I) and quadrature phase (Q) baseband signals. The I and Q baseband signals are coupled to the rectangular-to-polar converter 304, which, as the name suggests, converts the I and Q baseband signals into amplitude (i.e., 'envelope') and phase component signals, as indicated by the '$\rho$' and '$\theta$' symbols in FIG. 3, respectively.

In the transmitter's phase path, the phase DAC 310 operates to convert the phase component signal into an analog waveform, which is then coupled to the phase modulator 312 and VCO 314. Based on the phase information contained in the phase component signal, the phase modulator 312 and VCO 314 then generate a phase-modulated RF carrier signal (i.e., 'PM' signal). Meanwhile, in the envelope path, the envelope DAC 306 operates to convert the envelope component signal (i.e., the amplitude modulation or 'AM' signal) into an analog waveform. This analog envelope component signal is coupled to the envelope modulator 308, which operates to modulate a power supply voltage, $V_{supply}$ (e.g., as provided by the wireless communication device's battery), according to variations in amplitude of the envelope signal. In this manner an amplitude modulated power supply signal containing the envelope information of the original input signal is created.

To generate the final modulated RF carrier signal which the antenna 318 can radiate over the air, the amplitude modulated power supply signal, $V_S$, from the envelope path is coupled to a power supply port of the RF PA 316 while the RF PM signal from the VCO 314 in the phase path is coupled to an RF input of the RF PA 316. For a given gate (i.e. drive) voltage (assuming a FET is used for the transistor switch), as the modulated power supply voltage applied to the power supply port of the RF PA 316 is changed, the drain current of the transistor changes. This so-called 'drain modulation' operates to superimpose the envelope information from the envelope path onto the RF phase-modulated signal applied to the RF input of the RF PA 316 in the phase path. Because the peak amplitude of the signal into the RF PA 316 remains constant over time, linearity concerns involving amplifying non-constant envelope signals are avoided.

While use of switch-mode PAs in polar transmitters does result in a more efficient transmitter compared to more conventional quadrature modulator approaches, use of switch-mode PAs does present various problems. A first problem relates to the drive signals used to control the switching transistor of the RF PA. The drive signals applied to the switching transistor in state-of-the-art RF transmitters are sinusoidal in nature. However, sinusoidal waveforms have finite rise and fall times, which means that there are times between the ON and OFF states (described above) when the transistor switch is neither totally ON nor totally OFF. During these times the current-voltage product rises and, consequently, the power dissipated by the switching transistor also undesirably rises.

Another problem with using a switching transistor in a switch-mode PA is that the switching transistor can undesirably leak some of the drive signal applied to its input to its output. This leakage path is a well-known problem and is attributable to a parasitic capacitance formed between the input and output of the transistor (e.g., between the gate and drain of a FET type transistor or the base and collector of a BJT). To maximize efficiency the switching transistor is configured to operate in compression, a state in which the output is essentially independent of the magnitude of the signal applied to the transistor's control input. However, due to the presence of the parasitic capacitance, some of the input leaks through the parasitic capacitance to the transistor's output. This leaked signal is highly undesirable since it can cause distortion in the final RF output signal of the switch-mode PA.

Figure 4:
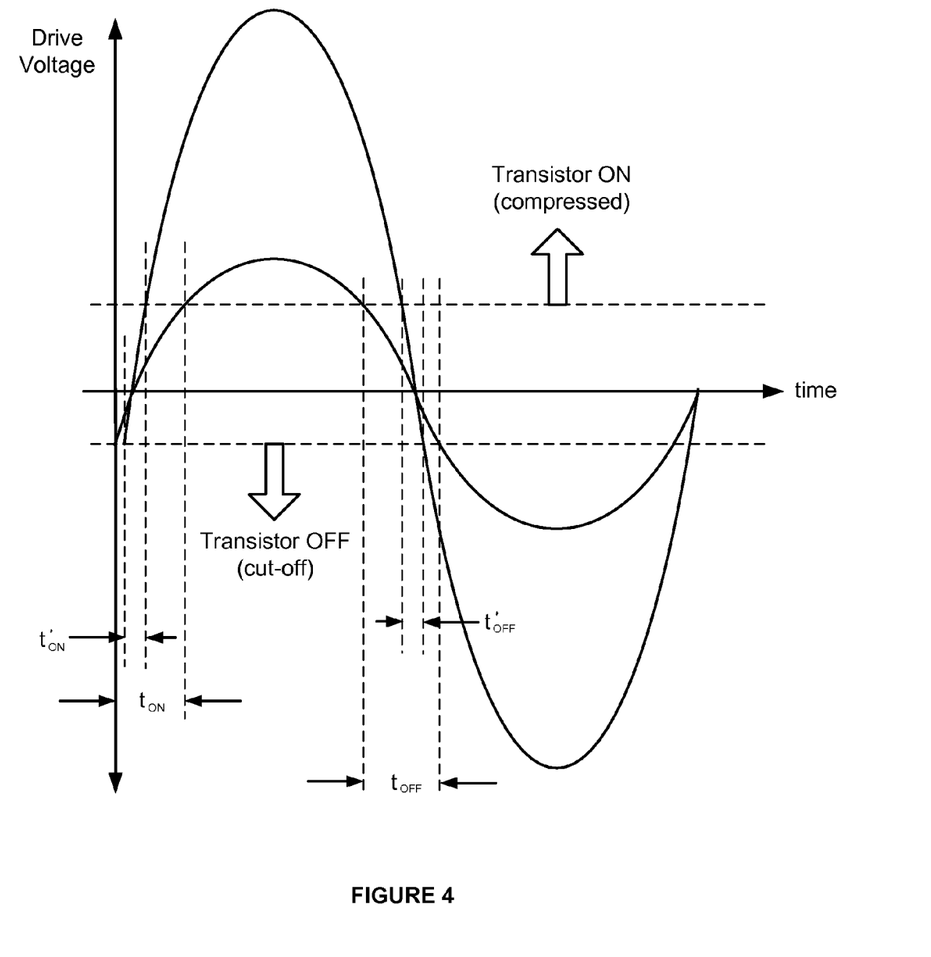
FIG. 4 is a voltage v. time diagram of a switch-mode PA drive signal, comparing the times needed to turn the transistor ON and OFF ($t'_{ON}$ and $t'_{OFF}$, respectively) for a higher-amplitude drive signal compared to the times needed to turn the transistor ON and OFF ($t_{ON}$ and $t_{OFF}$, respectively) for a lower-amplitude drive signal.

One approach that might be used to avoid the power dissipation problem would be to simply increase the amplitude of the drive signals. As illustrated in FIG. 4, the increased amplitudes would have the effect of reducing the times needed to turn the transistor ON and OFF ($t'_{ON}$ and $t'_{OFF}$, respectively) compared to the times needed without the amplification ($t_{ON}$ and $t_{OFF}$). Unfortunately, such an approach would exacerbate the leakage problem. It would also be wasteful from a power consumption perspective, since the resulting signal would have amplitudes higher than necessary to turn the transistor switch ON and OFF. In other words, excess power would be required and dissipated by the RF PA driver in order to generate the increased amplitude signals. For these reasons, simply increasing the amplitude of the sinusoidal drive signals is not, in most circumstances, a suitable solution.

Given the foregoing problems and limitations of RF PAs, it would be desirable to have methods and apparatus for reducing and/or controlling both the leakage and power dissipation of transistors used in RF PAs.

SUMMARY OF THE INVENTION

Methods and apparatus for controlling leakage and power in radio frequency power amplifiers (RF PAs) (e.g., switch-mode RF PAs) are disclosed. An exemplary RF PA apparatus includes an RF PA and a waveform converter. The waveform converter is configured to receive a sinusoidal RF signal and generate a nonsinusoidal RF signal therefrom. The nonsinusoidal RF signal is used to drive an active device (e.g., a field effect transistor (FET) or bipolar junction transistor (BJT)). The nonsinusoidal RF signal has signal characteristics that result in less leakage through the active device's input-output parasitic capacitance, compared to the leakage that would result if the sinusoidal RF signal was used to drive the active device.

According to one aspect of the invention the RF PA apparatus is implemented in a polar transmitter. In particular, the waveform converter of the RF PA apparatus is configured in the phase path of the polar transmitter and is operable to convert a sinusoidal RF phase-modulated signal (e.g., from a voltage controlled oscillator (VCO) of a phase modulator circuit) to a nonsinusoidal RF phase-modulated signal. The nonsinusoidal RF phase-modulated signal, which may be a square wave or substantially-square wave signal, is conditioned by the waveform converter to have an upper level that is no greater than needed to switch an active device of the polar transmitter's RF PA into compression (ON state). The waveform converter may be further configured to condition the nonsinusoidal RF phase-modulated signal to have transition times between signal levels needed to switch the active device between compression and cut-off which are less than or equal to transition times between signal levels of the sinusoidal RF signal.

Further aspects of the invention are described and claimed below, and a further understanding of the nature and advantages of the invention may be realized by reference to the remaining portions of the specification and the attached drawings.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 5:
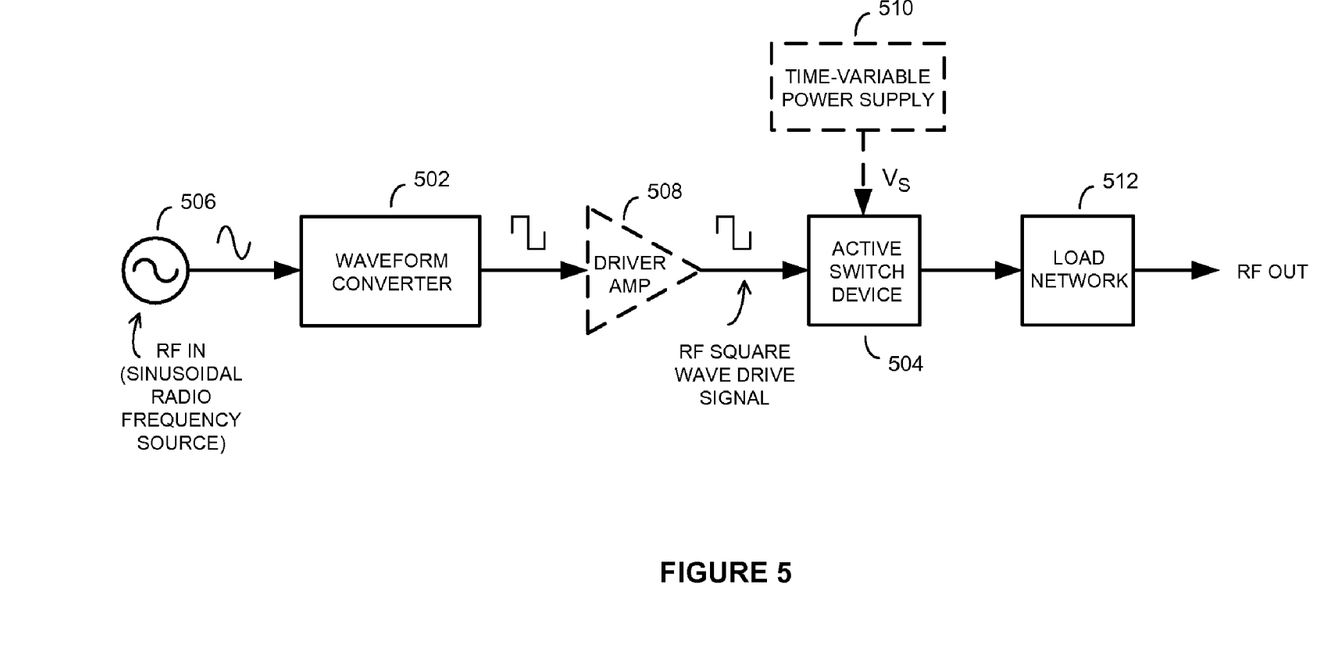
FIG. 5 is a block diagram of a waveform converter configured to drive the output stage of a switch-mode RF PA, according to an embodiment of the present invention.

Referring first to FIG. 5, there is shown a block diagram of a waveform converter 502 driving the output stage of a switch-mode RF PA 504 (represented by an "active switch device"), according to an embodiment of the present invention. As will be appreciated by those of ordinary skill in the art, the active switch device 504 may comprise one or more active devices, such as one or more BJTs or FETs, for example. The waveform converter 502 is configured to receive a sinusoidal RF signal, RF IN, from a sinusoidal RF source 506 and generate therefrom a drive signal for switching the switch-mode PA 504. As will be explained in more detail below, the drive signal generated by the waveform converter 502 has characteristics which compared to the unconverted signal help to control the leakage and power dissipation of the active switch devices of the switch-mode PA 504. For purposes of this disclosure the term "radio frequency signal" and "RF signal" are defined as being an electrical signal having a frequency at or above 300 MHz.

The signal generated by the waveform converter 502 is coupled directly to the control input of the active device switch 504. Alternatively, one or more additional amplifier stages for gain, biasing and/or drive purposes may be included between the waveform converter 502 and the active switch device output stage 504. FIG. 5 shows, for example, how an optional driver amplifier 508 (indicated by dashed lines) may be disposed between the output of the waveform converter 502 and the RF input of the active device switch 504.

The power setting input of the active device switch 504 (e.g., the drain of a FET, if a FET is used to implement the switch, or the collector of a BJT, if a BJT is used) is coupled to a power supply configured to supply a supply voltage, $V_S$. The supply voltage, $V_S$, may comprise a constant supply voltage (e.g., directly from a rechargeable battery or power regulator) or may comprise, depending on the application, a time variable power supply voltage (e.g., provided from an envelope modulator in the envelope path of a polar transmitter), as indicated by the optional time-variable power supply 510 in FIG. 5. In either case, since the active device switch 504 is configured for switch-mode operation, the output signal of the active switch 504 has an amplitude that depends on the amplitude of the supply voltage, $V_S$. This output signal is coupled to a load network 512, which filters out switching noise and unwanted harmonics and provides a final RF output, RF OUT, that is impedance matched to a load (not shown).

According to one embodiment of the invention, the waveform converter 502 comprises an amplitude limiter that is operable to limit the amplitude of the drive signal provided to the control input of the active device switch 504. Any suitable limiter circuit that effectively limits the amplitude of the drive signal to the active device switch 504 may be used. For example, a comparator circuit (like a Schmitt trigger type of circuit, for example), an amplifier, or attenuator may be used. Alternatively, the waveform converter 502 may be adapted for differential operation to convert the sinusoidal RF signal to a square wave, using a complementary differential pair and a latch, similar to that described in U.S. Patent Application Publication No. 2004/0239372, which is hereby incorporated by reference. According to another alternative, an RF signal that already has a nonsinusoidal waveform, such as the substantially-square waveform from a ring oscillator implemented with logic circuitry elements, is used directly, i.e., without the conventional bandlimiting techniques used to convert the substantially-square waveform to a sinusoidal waveform. The waveform converter 502 circuit may be integrated on the same integrated circuit (IC) chip as is the active device switch 504, integrated on a different IC chip, or implemented as a discrete or hybrid type device, separate from the circuitry used to implement the power amplifier itself. Finally, if semiconductor devices are used to implement the waveform converter 502, the semiconductor devices used may be silicon-based (e.g., based complementary metal-oxide-semiconductor (CMOS) based) or compound semiconductor based (e.g., GaAs, GaN, SiC, etc.).

Figure 6:
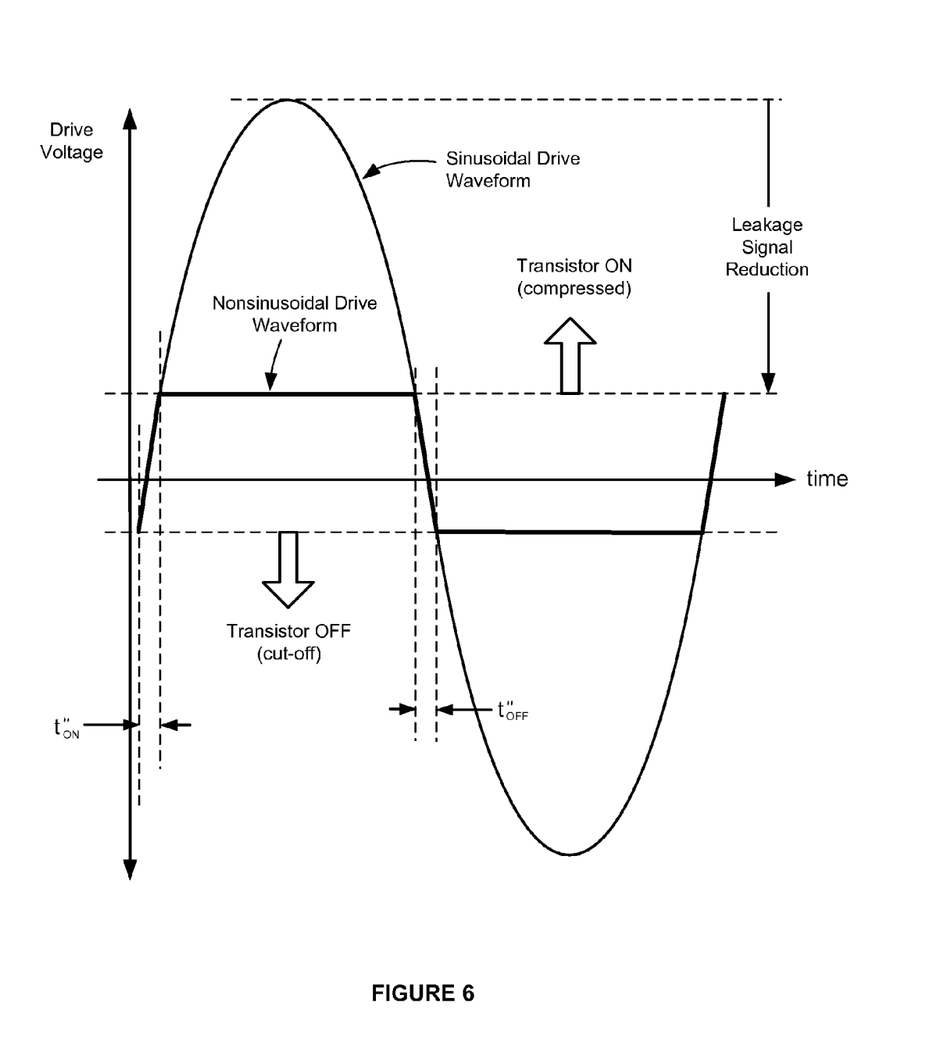
FIG. 6 is a voltage v. time diagram comparing the waveform properties of a prior art sinusoidal drive signal to the nonsinusoidal drive signal generated by the waveform converter in FIG. 5, and highlighting how driving the switch-mode RF PA with the nonsinusoidal drive signal beneficially provides leakage signal reduction.

According to one aspect of the invention illustrated in FIG. 6, the waveform converter 502 is operable to generate a square wave (or substantially-square wave) signal from the RF sinusoidal signal it receives from the sinusoidal RF source 506. According to another aspect of the invention, also illustrated in FIG. 6, the amplitude of the square wave or substantially-square wave drive signal generated by the waveform converter 502 (or the driver amplifier 508, if it is used) is increased only as high as is needed to turn the switch 504 ON (i.e., to set it into saturation or compression), as a means for conserving power. In this manner, driver losses resulting from excessively high drive signals are avoided, while, at the same time, leakage across the switch's parasitic capacitance is minimized. The transition times between the signal levels used to turn the switch 504 ON and OFF ($t''_{ON}$ and $t''_{OFF}$, respectively) are also less than or equal to transition times of a sinusoidal signal having a similar peak amplitude, or less than or equal to transition times of a sinusoidal signal from which the square wave or substantially-square wave signal is derived. Accordingly, in addition to conserving power by not requiring the driver amplifier to generate a large peak-to-peak sinusoidal drive signal, additional power reduction in the switch 504 itself can be realized by the shorter drive signal transition times of the square wave or substantially-square wave drive signal provided by the waveform converter 502 as a means for conserving power.

Figure 7:
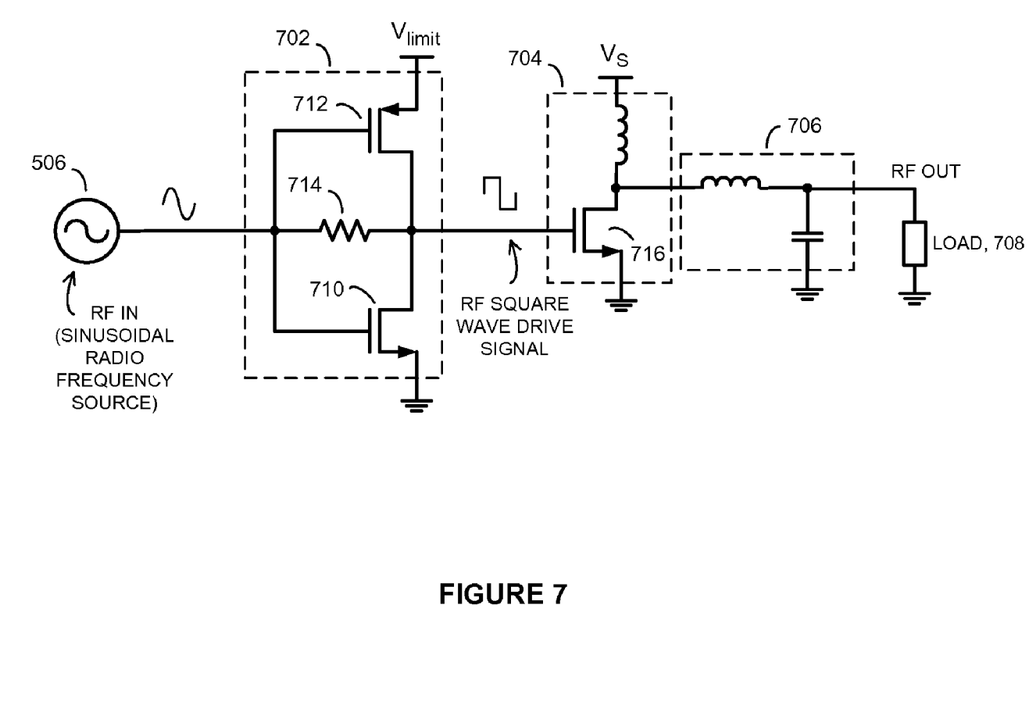
FIG. 7 is a drawing of a waveform converter configured to drive the output stage of a switch-mode RF PA, where the waveform converter comprises a limiter in the form of a CMOS gate, according to an embodiment of the present invention.

FIG. 7 is a drawing of an exemplary waveform converter 702 configured to drive the output stage 704 of a switch-mode RF PA, where the waveform converter 702 comprises a limiter in the form of a CMOS gate, according to an embodiment of the present invention. While other types of circuits may be used to implement a limiter, this example highlights how the CMOS gate type of limiter may be integrated with other circuit elements such as, for example, transmitter and/or power amplifier circuit elements, using readily available CMOS semiconductor processing technology as a means for conserving power. The limiter 702 comprises an n-channel metal-oxide-semiconductor FET (MOSFET) 710 and a p-channel MOSFET 712 having a common gate. The common gate serves as the input of the limiter 702. The drains of the two MOSFETs 710 and 712 are also coupled to one another, and serve as the output of the limiter 702. The source of the p-channel MOSFET 712 is coupled to a limiter voltage, $V_{limit}$, while the source of the n-channel MOSFET 710 is coupled to ground or other lower rail potential. An optional high-value resistance (e.g., 1 MΩ) resistor 714 is coupled between the gates and drains of the two MOSFETs 710 and 712. The high-value resistor 714 provides a biasing function and also forces the output signal of the limiter to conform to the shape of a square (or substantially-square) waveform having an amplitude determined by the magnitude of the limiter voltage, $V_{limit}$.

The square or substantially-square wave signal output of the limiter 702 is used to drive the transistor switch 716 of the switch-mode PA output stage 704 into compression or cause it to cut off. Accordingly, the transistor switch 716 provides an unfiltered output signal having an amplitude that changes with changes in the time-varying supply voltage, $V_S$, applied to the switch's power setting input (e.g., the drain, in the case of an FET). A load network 706 filters out switching noise and unwanted harmonics from the unfiltered output signal and provides the desired RF output signal, RF OUT, to the load 708.

Figure 8:
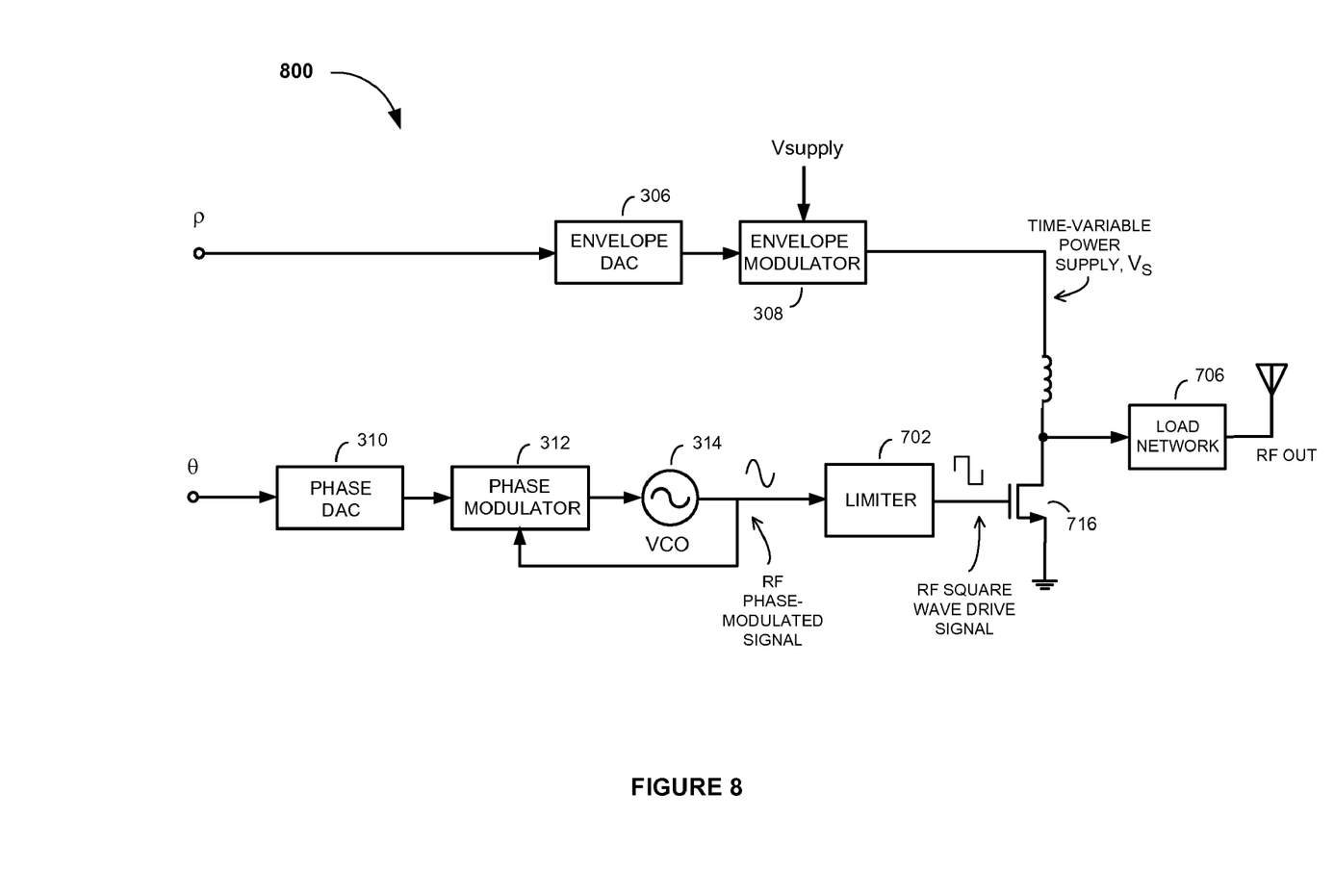
FIG. 8 is a diagram of a polar transmitter that has been modified to include a waveform converter, similar to that shown and described in connection with FIGS. 5 through 6, according to an embodiment of the present invention.

According to one embodiment of the invention, the sinusoidal RF signal source 506 for the waveform converter circuits in FIGS. 5 and 7 comprises a circuit that provides an angle modulated RF signal in an RF communications transmitter. FIG. 8 illustrates, for example, how the VCO 314 of the PLL in the phase path of a polar transmitter 800 comprises the sinusoidal RF signal source. The VCO 314 provides a phase-modulated RF sinusoidal signal to the CMOS gate limiter 702 (or other waveform converter described above). The limiter 702 operates on the phase modulated RF sinusoidal signal, similar to as described in connection with FIG. 7, thereby generating a phase-modulated signal having a square or substantially-square shape. This square or substantially-square wave, phase-modulated signal is used to drive the transistor switch 716 of the RF PA output stage. Other operational aspects of the polar transmitter are similar to that described above (see FIG. 3 and accompanying description).

While the above is a complete description of the preferred embodiments of the invention sufficiently detailed to enable those skilled in the art to build and implement the system, it should be understood that various changes, substitutions, and alterations may be made without departing from the spirit and scope of the invention as defined by the appended claims.

What is claimed is:

1. An RF power amplifier apparatus, comprising:
    an RF PA having an active device with an RF input configured to be driven by an RF drive signal, an RF output, and a parasitic capacitance formed between the RF input and RF output; and
    a waveform converter configured to receive a sinusoidal RF signal and generate a nonsinusoidal RF drive signal therefrom for outputting to the active device, said nonsinusoidal RF drive signal used to drive said active device, and having signal characteristics that result in less leakage of the drive signal from the RF input to the RF output via the parasitic capacitance, compared to an amount of leakage that would result if the sinusoidal RF signal was used to drive the active device, wherein the nonsinusoidal RF drive signal generated by the waveform converter has a lower peak amplitude than a peak amplitude of the sinusoidal RF signal.

2. The RF power amplifier apparatus of claim 1 wherein said waveform generator comprises a comparator circuit.

3. The RF power amplifier apparatus of claim 1 wherein the waveform converter comprises a limiter and the nonsinusoidal RF drive signal generated by the limiter comprises a square or substantially-square wave signal.

4. The RF power amplifier apparatus of claim 3 wherein the limiter is operable to limit the sinusoidal RF signal so that an upper level of the resulting square or substantially-square wave signal is no greater than needed to configure the active device into compression.

5. The RF power amplifier apparatus of claim 4 wherein the limiter is further operable to set a lower level of the resulting square or substantially-square wave signal to a value that causes the active device to be cut off.

6. The RF power amplifier apparatus of claim 1 wherein the sinusoidal RF signal and the nonsinusoidal RF drive signal have frequencies that are greater than or equal to approximately 300 MHz.

7. The RF power amplifier apparatus of claim 1 wherein the nonsinusoidal RF drive signal has transition times between signal levels needed to convert the active device between compression and cut-off that are less than or equal to transition times between signal levels of the sinusoidal RF signal.

8. The RF power amplifier apparatus of claim 1 wherein said RF PA comprises a switch-mode RF PA.

9. The RF power amplifier apparatus of claim 1 wherein the waveform converter comprises means for conserving power by generating the nonsinusoidal RF drive signal as a square or substantially-square wave signal, and by limiting the sinusoidal RF signal so that an upper level of the resulting square or substantially-square wave signal is no greater than needed to configure the active device into compression, thereby conserving power.

10. The RF power amplifier apparatus of claim 1 wherein the waveform converter outputs the nonsinusoidal RF drive signal to a driver amplifier for processing before the nonsinusoidal RF drive signal is outputted to the active device.

11. A method of controlling an active device of an RF PA, comprising:
    receiving a sinusoidal RF signal;
    converting the sinusoidal RF signal to a nonsinusoidal RF signal having an upper signal level and a lower signal level; and
    coupling the nonsinusoidal RF signal to a control input of an active device of RF PA,
    wherein converting the sinusoidal RF signal to a nonsinusoidal RF signal includes setting the upper level to a value that is no greater than needed to configure the active device into a compressed state, and
    wherein the nonsinusoidal RF drive signal has a lower peak amplitude than a peak amplitude of the sinusoidal RF signal.

12. The method of claim 11 wherein converting the sinusoidal RF signal to a nonsinusoidal RF signal results in a nonsinusoidal RF signal having transition times between signal levels needed to convert the active device between compression and cut-off that are less than or equal to transition times between signal levels of the sinusoidal RF signal.

13. The method of claim 11 wherein receiving a sinusoidal RF signal comprises receiving a sinusoidal RF phase-modulated signal from a phase path of a polar transmitter.

14. The method of claim 11 wherein the RF PA comprises a switch-mode RF PA.

15. The method of claim 11 wherein the nonsinusoidal RF signal comprises a square or substantially-square wave signal.

16. The method of controlling an active device of an RF PA of claim 11, further comprising processing the sinusoidal RF signal at a driver amplifier prior to coupling the nonsinusoidal RF signal to the control input of the active device of the RF PA.

* * * * *